United States Patent [19]

Tench et al.

[11] Patent Number: 5,605,719
[45] Date of Patent: Feb. 25, 1997

[54] METHOD OF TRANSPORTING AND APPLYING A SURFACE TREATMENT LIQUID USING GAS BUBBLES

[75] Inventors: D. Morgan Tench, Ventura, Calif.; Egbert U. Beske, Kreuzwertheim, Germany

[73] Assignee: Rockwell International Corporation, Seal Beach, Calif.

[21] Appl. No.: 398,473

[22] Filed: Mar. 3, 1995

[51] Int. Cl.$^6$ .................................................. C23C 16/00
[52] U.S. Cl. .................. 427/248.1; 427/430.1; 427/445
[58] Field of Search ............... 427/249.1, 430.1, 427/445

[56] References Cited

U.S. PATENT DOCUMENTS

| | | | |
|---|---|---|---|
| 4,158,076 | 6/1979 | Wallsten | 427/294 |
| 4,275,656 | 6/1981 | Choma | 101/211 |
| 5,104,494 | 4/1992 | Tench et al. | 205/125 |
| 5,162,082 | 11/1992 | Elliott | 204/140 |
| 5,190,591 | 3/1993 | Okano et al. | 118/667 |
| 5,284,520 | 2/1994 | Tanaka | 118/600 |
| 5,286,529 | 2/1994 | Nakayama et al. | 427/430.1 |
| 5,304,297 | 4/1994 | Tench et al. | 205/101 |
| 5,397,604 | 5/1995 | Phillips, III et al. | 427/430.1 |

*Primary Examiner*—Benjamin Utech

[57] ABSTRACT

A method is provided for dynamically transporting and applying a liquid to a surface, such as the bottom surface of a printed wiring assembly (PWA). The liquid may comprise an aqueous reducing agent solution for removing surface oxides prior to a soldering operation. The PWA is placed in proximity with the treatment solution held in a reservoir. Gas bubbles generated in the solution dynamically elevate and apply the solution to the bottom surface of the PWA. The bubbles may be formed by a non-oxidizing gas, such as nitrogen, introduced through a porous material. A flat surface of porous material produces a uniform bubble size that allows controlled and precise application of the solution. The porous material and the gas pressure may be varied to so that the bubbles elevate the solution to the desired level. The gas bubbles are short-lived (without surfactants) so that rapid transport, replenishment, and regeneration of the solution can be achieved. Moreover, nitrogen gas is injected at the PWA surface as the bubbles burst so that reaction of the solution or the PWA with oxygen is minimized. The gas bubble method also minimizes the pressure that forces treatment liquid through PWA through-holes to the top surface where it can be difficult to remove.

14 Claims, 1 Drawing Sheet

METHOD OF TRANSPORTING AND APPLYING A SURFACE TREATMENT LIQUID USING GAS BUBBLES

TECHNICAL FIELD

The present invention relates to methods of transporting and applying a liquid to a surface and, in particular, to a method of applying a surface treatment liquid using bubbles of gas to elevate and transport the liquid from a reservoir to the surface being treated.

BACKGROUND OF THE INVENTION

The application of surface treatment liquids is pertinent to the field of soldering electronic components and circuit boards. In an automated production system for soldering printed wiring assemblies (PWAs-printed wiring boards stuffed with components), for example, it is desirable to apply an oxide reduction solution to prepare the PWAs for soldering. A method of restoring solderability of electronic components by applying an oxide reduction solution is described in U.S. Pat. No. 5,104,494 issued Apr. 14, 1992. A further description of reducing agents and their regeneration is provided in U.S. Pat. No. 5,304,297 issued Apr. 19, 1994. The teachings of these prior patents are incorporated herein by reference. In a "fluxless" soldering system (i.e., one in which an oxide removing agent is not present during the actual soldering operation), the reduction solution application system must be compatible with the PWA conveyer system, must allow sufficient bottom clearance for the electronic components and leads, and should minimize the amount of treatment solution applied to the top side of the PWA (where it is more difficult to remove). A method and apparatus for applying a reduction treatment solution by forming a "wave" of the fluid is described in U.S. Pat. No. 5,162,082 issued on Nov. 10, 1992, the teachings of which are incorporated herein by reference.

A need has been identified for improved soldering systems. The desirability of a continuous surface treatment and fluxless soldering operation, along with space and compatibility requirements of PWA conveyor systems, have led to difficulties in conveying PWAs to the surface of a treatment liquid contained in a reservoir. In addition, there is a desire to minimize oxygen concentration in the atmosphere around the PWAs during oxide reduction treatment to avoid excessive discharge of the reducing agent (which would lower the effectiveness of the reduction treatment) and to avoid reoxidation of the treated PWAs before soldering.

SUMMARY OF THE INVENTION

In the method of the present invention, a liquid is transported from a container or reservoir and applied to a surface, such as the bottom surface of a printed wiring assembly (PWA—a printed wiring board stuffed with electronic components), that is placed in proximity with the liquid in the reservoir. The liquid may comprise an aqueous reducing agent solution for removing oxides from a PWA in preparation for soldering, for example. In the method, which may be termed Gas Actuated Liquid Elevation (GALE), gas bubbles are used to transport the reducing solution from the reservoir and apply it to the bottom surface of the PWA. The bubbles may be formed in the solution by gaseous nitrogen (or other non-oxidizing gas) introduced through a porous device or material, such as porous plastic of the type commonly known and used in the art of foam fluxers, for example. The gas dispersion material may be formed in any appropriate shape, but a flat surface has been found to produce a uniform bubble size that allows controlled and precise application of the solution. For an aqueous solution without surfactants (such as the preferred reducing agent solution), the gas bubbles are short-lived so that rapid solution transport and replenishment is achieved. Dynamic elevation of the solution more than two centimeters above the static level in the reservoir has been demonstrated using a gas pressure of about 50 psi. In the process of applying the reducing agent solution to a PWA, nitrogen gas is injected right at the PWA surface as the bubbles burst. This effect minimizes the reaction of the solution with oxygen. The use of bubbles for treating a PWA also has the advantage of minimizing the pressure that forces treatment liquid to the top surface of the PWA (via through-holes in the PWA), where it is difficult to remove effectively from under components. A principal object of the invention is effective transport and application of a surface treatment liquid. A feature of the invention is generation of short-lived gas bubbles to transport and apply the liquid to the treated surface. An advantage of the invention is controlled application and replenishment of a reducing agent treatment solution in a non-oxidizing environment.

BRIEF DESCRIPTION OF THE DRAWINGS

For a more complete understanding of the present invention and for further advantages thereof, the following Detailed Description of the Preferred Embodiments makes reference to the accompanying Drawings, in which.

DETAILED DESCRIPTION OF THE PREFERRED EMBODIMENTS

Figure 1:
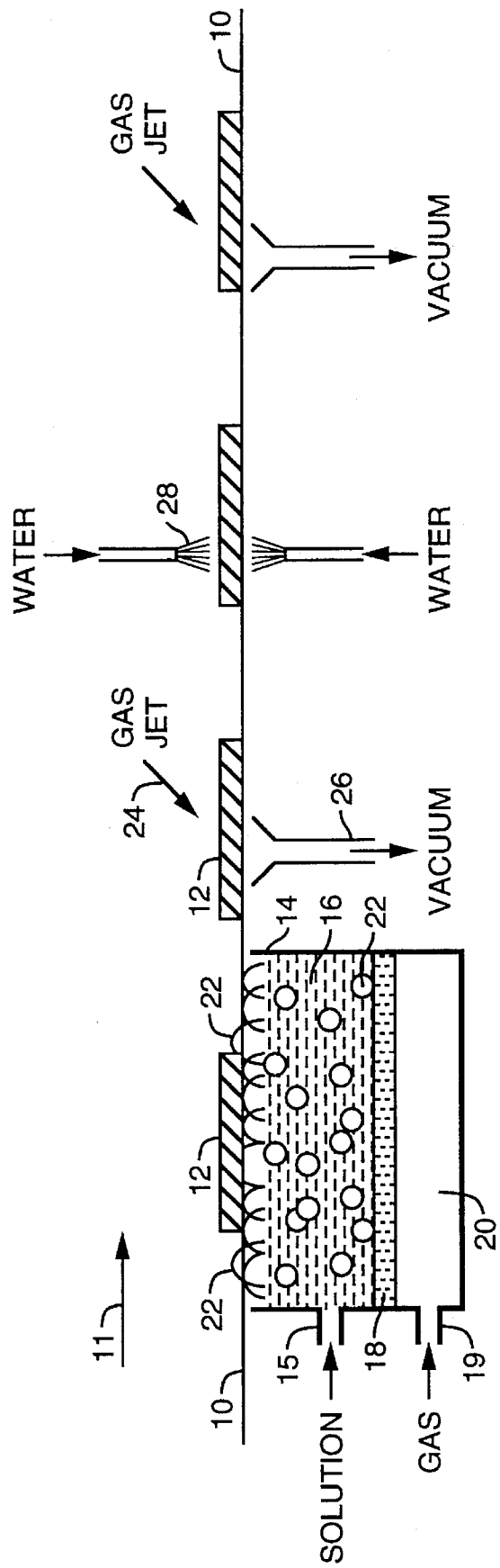
FIG. 1 is a schematic side view of an apparatus for elevating and applying a surface treatment liquid in accordance with the method of the present invention.

In basic form, the present invention comprises a method of transporting and applying a liquid to a surface. The method is applicable to the field of "fluxless" soldering, in which electronic components, parts, devices, or assemblies, such as printed wiring assemblies (PWAs), are treated with a reducing agent solution to remove surface oxides prior to soldering. In an automated soldering system, the present invention provides a continuous surface treatment process that is compatible with PWA conveyor and soldering systems. The present method improves on the prior art by transporting the treatment solution to the bottom surface of PWAs and rapidly replenishing it to avoid depletion of the reactive agent. The reducing agent application system allows sufficient bottom clearance for electronic components and leads and minimizes the amount of treatment solution applied to the top side of PWAs, where it can be difficult to remove from under components on the board. The method also minimizes the oxygen concentration in the atmosphere around PWAs during oxide reduction treatment to avoid excessive discharge of the reducing agent (which would lower the effectiveness of the reduction treatment) and to avoid reoxidation of treated PWAs before soldering. A schematic side view of an apparatus for performing the method of the present invention is illustrated in FIG. 1.

FIG. 1 illustrates a side view of a conveyor line 10 moving from left to right, as indicated by arrow 11. As an example, conveyor line 10 may serve to transport solderable parts 12, such as electronic PWAs, through an automated soldering system (not shown). In this example, the present invention includes a reservoir 14 containing a reducing agent solution 16 that may be replenished through an inlet 15 connected to a regeneration cell (not shown) in which excess solution 16 is collected. Solution 16, which is further described in U.S. Pat. Nos. 5,104,494 and 5,304,297 (incorporated by reference), comprises an oxide reduction treatment fluid that is applied to the bottom surface of parts 12. It is well known in the prior art that solution 16 may as be applied to parts 12 using a "wave" of fluid, borrowing the technique from wave soldering as further described in U.S. Pat. No. 5,162,082.

In the present invention, reservoir 14 includes a porous means or material 18, such as a porous sheet of polypropylene or polyethylene, for example, for dispersing gas and introducing bubbles into solution 16. An inlet 19 may be used to provide gas 20 to means 18 in reservoir 14. Porous means 18 may comprise any device or material in any shape suitable for generating gas bubbles 22 in a liquid, although a flat surface is preferred to produce uniform bubbles 22 for controlled and precise application of solution 16. When used with a reducing agent solution 16, gas 20 typically comprises an inert or non-oxidizing gas such as nitrogen, for example. Gas 20 is provided to reservoir 14 at sufficient pressure to pass through porous means 18 and generate bubbles 22 in solution 16. Porous means 18 and the pressure of gas 20 may be varied as required to generate bubbles 22 of sufficient quantity and desired size in solution 16.

Gas bubbles 22 generated by porous means 18 rise through solution 16 to expand above the static level of solution 16 and eventually burst. This method, which may be termed Gas Actuated Liquid Elevation (GALE), uses gas bubbles 22 to elevate and apply reducing solution 16 dynamically to the bottom surface of pans 12. A dynamic solution rise or elevation of more than two centimeters (i.e., above the static level of solution 16) has been demonstrated using a gas pressure of about 50 psi. For an aqueous solution 16 without surfactants (such as the preferred reducing agent solution), gas bubbles 22 are short-lived, providing rapid solution transport and replenishment and allowing regeneration of the reactive agent as it is consumed during oxide reduction at the PWA surface. The dynamic short-lived bubbles and rapid solution transport of the present method contrast sharply with prior art foam fluxers, which use long-lived bubbles (i.e., relatively static bubbles produced by foam-inducing surfactants) and no significant regeneration of the flux solution.

A typical soldering operation is performed in a non-oxidizing atmosphere (usually nitrogen) to minimize oxidation that degrades solderability of parts 12. In the process of applying a reducing agent solution 16 to part 12 (such as a PWA) in accordance with the present invention, nitrogen gas 20 is injected right at the surface of part 12 as bubbles 22 burst. As a result, exposure of part 12 and solution 16 to oxygen is minimized. This method of treating part 12 with solution 16 also has the advantage of minimizing the pressure that forces solution 16 to the top surface of parts such as PWAs (via through-holes in the PWAs), where it is difficult to remove effectively from under components on the PWAs.

After solution 16 has been applied to part 12 by dynamic bubbles 22 (and detrimental oxides on part 12 have been reduced), most of solution 16 can be removed by a dry system using an angled gas jet 24 (such as a "nitrogen knife") to move any residual solution 16 along the top a surface of part 12. A vacuum source 26 may be used to remove solution 16 from the bottom surface. In addition, part 12 may be rinsed, if necessary, by a fine spray of deionized water 28 (top and bottom), driven by nitrogen gas, for example. Spray units 28 can travel back and forth along the surface of parts 12 and spray only small quantities of water. Most of the residual rinse water can be removed (if necessary or desirable) by a second nitrogen knife and vacuum system, as illustrated. All of solution 16 and rinse water removed from parts 12 can be collected and fed into a separate holding tank or a solution regeneration unit (not shown). Excess water can be removed by evaporation, for example. Final drying of parts 12, if necessary before soldering, can be accomplished in a convection oven along conveyor line 10. The suitability of the present method for use in a soldering operation was tested using a small applicator system having a square (10 cm×10 cm) porous polypropylene or polyethylene sheet 18 for generating bubbles 22 in oxide reduction solution 16. Tin-lead coated printed wiring board (PWB) coupons (having the same dimensions) were positioned on a rack 2 cm above the level of solution 16 inside a nitrogen atmosphere glove box. Solution 16 was recirculated through inlet 15 by a peristaltic pump from a regeneration cell to/from reservoir 14. Nitrogen gas 20 was fed to the bottom side of the porous sheet 18 with sufficient pressure to produce a bubble layer rising at least 2 cm above the static level of solution 16. Porous sheets 18 having various average pore sizes (10 to 120 μm) and thicknesses (0.6 to 1.0 cm) were evaluated with comparable results. After treatment of the PWB coupons for various times (10 to 30 seconds), through-holes on the PWB coupons were analyzed to determine the extent of oxide removal. Testing of PWB coupons as received (prior to treatment with solution 16) indicated large amounts of detrimental oxides, which were effectively removed by the dynamic bubble application of solution 16 as described above. Good uniformity of the application of solution 16 was demonstrated by testing through-holes at various locations on the PWB coupons.

As mentioned above, the method of elevating and applying solution 16 using gas bubbles 22 is distinctly different from known methods of applying foam fluxers in a soldering operation. In the present method, bubbles 22 are short-lived (unlike foams) because no surfactants are used in solution 16. Short-lived bubbles 22 provide dynamic, rapid transport and replenishment of solution 16 and liberal application of solution 16 to parts 12 for reduction of surface oxides detrimental to solderability. Rapid transport also allows regeneration of the reactive agent in the solution after it is spent in reducing the surface oxides. In contrast, surfactants are used in prior art foams to produce long-lived bubbles where the object is to minimize the amount of flux applied to a PWA surface and there is no requirement for regeneration of the flux.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

We claim:

1. A method of transporting and applying a surface treatment solution to a part, comprising the steps of:

providing a reservoir containing said surface treatment solution at a static fluid level, said solution having no foam-inducing surfactants;

connecting said reservoir to a source of gas;

generating bubbles of said gas in said solution, said bubbles rising above said static level of said solution in said reservoir; and placing the part to be treated above said static level of said solution in said reservoir such that said bubbles rising above said static level contact the part and burst, thereby applying said solution to the part.

2. The method of claim 1, further comprising the step of placing a porous material in said reservoir for dispersing said gas and generating said bubbles in said surface treatment solution.

3. The method of claim 1, wherein the step of connecting said reservoir to a source of gas comprises connecting said reservoir to a source of nitrogen gas.

4. The method of claim 1, wherein the step of providing said reservoir containing said solution includes the step of replenishing said surface treatment solution to maintain said static level of said solution in said reservoir.

5. The method of claim 1, further comprising the step of removing said surface treatment solution applied to the part.

6. A method of transporting and applying a surface treatment solution to a solderable part for reducing metallic surface oxides on the part, comprising the steps of:

providing a reservoir foe containing said surface treatment solution, said solution having no foam-inducing surfactant;

filling said reservoir with said solution to a static fluid level;

connecting said reservoir to a source of non-oxidizing gas;

generating bubbles of said non-oxidizing gas in said solution, said bubbles rising in said solution and expanding above said static level of said solution; and positioning the part above said static level of said solution in said reservoir so that said bubbles expanding above said static level contact the part and burst, there by applying said solution and reducing said metallic surface oxides on the part.

7. The method of claim 6, further comprising the step of placing a porous material in said reservoir for dispersing said gas and generating said bubbles in said surface treatment solution.

8. The method of claim 6, wherein the step of filling said reservoir with said solution includes the step of replenishing said solution to maintain said static level of said solution in said reservoir.

9. The method of claim 6, wherein the step of connecting said reservoir to a source of non-oxidizing gas comprises connecting said reservoir to a source of nitrogen gas.

10. The method of claim 6, further comprising the step of removing said surface treatment solution from the part after said step of reducing said metallic surface oxides.

11. A method of transporting and applying a surface treatment solution to a solderable part for reducing metallic surface oxides on the part, comprising the steps of:

providing a metallic surface oxide reduction treatment solution having no foam-inducing surfactants;

filling a reservoir with said solution to a static fluid level;

connecting said reservoir to a source of nitrogen gas;

providing a means in said reservoir for dispersing said nitrogen gas and generating bubbles of said nitrogen gas in said solution;

generating said bubbles to rise in said solution and expand above said static level of said solution; and positioning the solderable part above said static level of said solution in said reservoir so that said bubbles expanding above said static level contact the part and burst, thereby applying said metallic surface oxide reduction treatment solution and reducing said metallic surface oxides on the part.

12. The method of claim 11, wherein the step of providing means for dispersing said nitrogen gas and generating said bubbles includes the step of placing a porous material in said reservoir.

13. The method of claim 11, wherein the step of filling said reservoir with said solution includes the step of replenishing said metallic surface oxide reduction treatment solution to maintain said static level of said solution in said reservoir.

14. The method of claim 11, further comprising the step of removing said metallic surface oxide reduction treatment solution from the part after said step of reducing said metallic surface oxides.

* * * * *